(12) United States Patent
Schaeffer et al.

(10) Patent No.: US 12,392,848 B2
(45) Date of Patent: Aug. 19, 2025

(54) MICROWAVE POWER AMPLIFIER ARRANGEMENT FOR A PULSED EPR SYSTEM

(71) Applicant: Bruker France SAS, Wissembourg (FR)

(72) Inventors: Jacky Schaeffer, Printzheim (FR); Michael Maixner, Bietigheim (DE)

(*) Notice: Subject to any disclaimer, the term of this patent is extended or adjusted under 35 U.S.C. 154(b) by 196 days.

(21) Appl. No.: 18/486,566

(22) Filed: Oct. 13, 2023

(65) Prior Publication Data
US 2024/0125876 A1 Apr. 18, 2024

(30) Foreign Application Priority Data
Oct. 14, 2022 (EP) ..................................... 22315239

(51) Int. Cl.
*G01R 33/36* (2006.01)
*G01R 33/60* (2006.01)
(Continued)

(52) U.S. Cl.
CPC ......... *G01R 33/3614* (2013.01); *G01R 33/60* (2013.01); *H03F 1/26* (2013.01);
(Continued)

(58) Field of Classification Search
CPC ....... G01R 33/3614; G01R 33/60; H03F 1/26; H03F 3/211; H03F 2200/372; H03F 2203/21181; H03F 3/19; H03F 3/21
See application file for complete search history.

(56) References Cited

U.S. PATENT DOCUMENTS

| | | | | |
|---|---|---|---|---|
| 5,351,013 A | * | 9/1994 | Alidio | ...................... H03G 1/04 330/289 |
| 2014/0055195 A1 | * | 2/2014 | Engala | .................. H03F 1/3241 330/124 R |

FOREIGN PATENT DOCUMENTS

| | | | |
|---|---|---|---|
| EP | 0567116 B1 | 7/2000 | |
| EP | 0937262 B1 | 4/2003 | |
| EP | 2169825 A1 * | 3/2010 | ............... H03F 3/72 |

OTHER PUBLICATIONS

Shi Zhifu et al: "An X-band pulsed electron paramagnetic resonance spectrometer with time resolution improved by a field-programmable-gate-array based pulse generator", Review of Scientific Instruments, vol. 89, No. 12, Dec. 10, 2018.
(Continued)

*Primary Examiner* — G. M. A Hyder
(74) *Attorney, Agent, or Firm* — Benoît & Côté Inc.

(57) ABSTRACT

A microwave power amplifier arrangement for an electron paramagnetic resonance (EPR) system provides amplified microwave pulses having a microwave frequency in the X-band. The arrangement has a microwave input and a microwave output, and comprises at least one transistor amplifier device, and at least one switchable reflection device. A respective transistor amplifier device comprises a transistor amplifier device input directly or indirectly connected to the microwave input (2), at least one transistor, and a transistor amplifier device output directly or indirectly connected to the microwave output. A respective switchable reflection device comprises a PIN diode and a lambda/4 line connected directly or indirectly to the transistor amplifier device output of at least one transistor amplifier device and to a first port of the PIN diode, with lambda being the wavelength of the microwave radiation within the lambda/4 line. A second port of the PIN diode is connected to ground.

16 Claims, 3 Drawing Sheets

(51) Int. Cl.
    *H03F 1/26*        (2006.01)
    *H03F 3/21*        (2006.01)

(52) U.S. Cl.
    CPC ........ *H03F 3/211* (2013.01); *H03F 2200/372* (2013.01); *H03F 2203/21181* (2013.01)

(56) References Cited

OTHER PUBLICATIONS

Doll A: "Pulsed and continuous-wave magnetic resonance spectroscopy using a low-cost software-defined radio", AIP Advances, vol. 9, No. 11, Nov. 18, 2019.

Tabuchi Y et al: "Total compensation of pulse transients inside a resonator", Journal of Magnetic Resonance, vol. 204, No. 2, Mar. 23, 2010, pp. 327-332.

Krishna Murali C., et al: "The Development of Time-Domain In Vivo EPR Imaging at NCI", Applied Magnetic Resonance, vol. 52, No. 10, Aug. 4, 2021 (Aug. 4, 2021), pp. 1291-1309.

German Wikipedia entry "Wanderfeldröhre", (https://de.wikipedia.org/wiki/Wanderfeldröhre), accessed on Jul. 11, 2022.

SdT Ciqtek EPR100 screenshot (https://en.ciqtek.com/products/detail/epr-spectroscopy-epr100.html), accessed on Sep. 26, 2022.

Mispelter et al. Chapter 4 "Interfacing the NMR Probehead" In: "NMR probeheads for biophysical and biomedical experiments : theoretical principles & practical guidelines (2nd Edition)", Imperial College Press,, Jan. 1, 2015, pp. 197-294.

\* cited by examiner

MICROWAVE POWER AMPLIFIER ARRANGEMENT FOR A PULSED EPR SYSTEM

CROSS-REFERENCE TO RELATED APPLICATIONS

This application claims priority to European Patent Application No. 22315239.8, filed Oct. 14, 2022, the content of which is incorporated herein by reference.

BACKGROUND OF THE INVENTION

Field of the Invention

The invention relates to a microwave power amplifier arrangement for an electron paramagnetic resonance (EPR) system, wherein the microwave power amplifier arrangement is adapted for providing amplified microwave pulses of a microwave radiation having a microwave frequency MF, with MF being in the X-band, with the microwave power amplifier arrangement having a microwave input and a microwave output.

Description of the Related Art

Electron paramagnetic resonance (EPR) is a spectroscopic method for investigating the chemical composition of samples containing a permanent magnetic moment, which may be caused by unpaired electrons. EPR is based on resonant microwave absorption in the sample exposed to an externally applied magnetic field.

In pulsed EPR, the sample to be investigated is held in a constant external magnetic field $B_0$, and the sample is exposed to a single high-power pulse of microwave radiation of a given frequency MF. In this way, a large frequency range can be excited simultaneously, and the microwave response of the sample is recorded. Generally, shorter pulse times lead to larger frequency ranges that can be investigated at a time.

For providing amplified microwave pulses in pulsed EPR, in general so called travelling wave tubes (TWTs) are used. However, TWTs are complex components that have become rather expensive, and suppliers have become rare.

In principle, transistor amplifiers can be used to provide amplified microwave pulses. At the control input of a respective transistor, a control signal can be applied, switching the amplification function in correspondence to the desired signal duration. However, transistor amplifiers delivering the required power for pulsed EPR have a turn-off time at the end of a pulse that is rather long, which means that part of the EPR signal is lost during the reception phase.

In more detail, transistor amplifiers contain parasitic elements like capacitors and inductors. Further, biasing circuits needed to run the transistors also contain capacitors and inductors. Energy is stored in these elements and flows out of the circuit after the transistor has been switched off by the control signal at the end of the pulse. This causes unwanted noise in the EPR measurement, also called a noise tail. Pulsed EPR is very sensitive, and the unwanted noise at the end of a pulse can mask a big part of the EPR signal, and in this way reduces the sensitivity of the measurement. With available transistor amplifiers, for generating amplified microwave pulses up to about 1000 W at 9-10 GHz frequency range, noise tails of 150-200 ns are observed. However, in a typical pulsed EPR experiment, the delay time between the end of a high power microwave pulse and the beginning of EPR signal acquisition is at maximum 80 ns. As a result, applying transistor amplifiers for pulsed EPR would result in a considerable loss of sensitivity.

SUMMARY OF THE INVENTION

The present invention provides a microwave power amplifier arrangement for pulsed EPR that is inexpensive and simple in design, and can reduce noise. This object is achieved by a microwave power amplifier arrangement as described above, characterized in that the microwave power amplifier arrangement comprises
 at least one transistor amplifier device, and
 at least one switchable reflection device, wherein a respective transistor amplifier device comprises
 a transistor amplifier device input directly or indirectly connected to the microwave input,
 at least one transistor, and
 a transistor amplifier device output directly or indirectly connected to the microwave output, and wherein a respective switchable reflection device comprises
 a lambda/4 line, connected directly or indirectly to the transistor amplifier device output of at least one transistor amplifier device and to a first port of a PIN diode, with lambda being the wavelength of the microwave radiation within the lambda/4 line, and
 the PIN diode, with a second port of the PIN diode connected to ground.

The present invention applies a solid state power amplification for providing amplified microwave pulses that can be used in pulsed EPR measurements. At least one transistor amplifier device for amplifying microwave pulses is provided for this purpose. Further, at least one switchable reflector device is provided. In case of parasitic effects, i.e., energy flowing off from capacitors and inductors in a respective transistor and/or its biasing circuit, the at least one switchable reflector device can keep this energy from reaching the microwave output. As a result, a noise tail of the at least one transistor amplifier device may be cut off or avoided, respectively. Accordingly, the solid state power amplification, which is simple and inexpensive to implement, can be used to provide amplified microwave pulses for pulsed EPR at a low noise level, and in particular also at a high microwave power.

Each transistor amplifier device comprises one or more transistors for amplifying a microwave signal received at its transistor amplifier device input and providing an amplified microwave signal at its transistor amplifier device output. Amplification at the transistor amplifier device occurs as long as a suitable control signal (in particular DC control signal) is present at a control input of the transistor amplifier device. However, discharging of capacitors and inductors generally leads to a microwave power that decays over some time at the transistor amplifier device output, instead of a desired immediate turn off.

Each switchable reflection device has a function of an RF switch. The lambda/4 line is connected with its end directly or indirectly connected to the transistor amplifier device output (i.e., its end facing away from the PIN diode, also called first end) to a feeding line; the feeding line is typically a switching line of a switching stage or a local feeding line of a combined stage (see below).

By applying a first suitable control signal (typically DC type positive control signal) to the PIN diode, typically by applying the first control signal to the feeding line or the lambda/4 line at its end (first end) directly or indirectly connected to the transistor amplifier device output, in a way that some continuous/average current flows through the PIN diode, the PIN diode of the switchable reflection device can be brought into a low resistance state for RF signals/microwave signals. In this case the lambda/4 line has effectively a short circuit (to ground) at its end of the second port (also called second end of the lambda/4 line). Since the lambda/4 line inverts impedance, this means that the lambda/4 line at its end (first end) directly or indirectly connected to the to the transistor amplifier device output will be seen as open circuit, and then the lambda/4 line has no more influence on the feeding line. All microwave power flowing into the feeding line can pass the connecting point (branching point) to the lambda/4 line unhindered.

However, if a second suitable control signal (e.g., a zero voltage or DC type negative control signal) is applied to the PIN diode, or to the lambda/4 line at its end (first end) directly or indirectly connected to the transistor amplifier device output, respectively, in a way that no continuous/average current flows through the PIN diode, then the PIN diode of the switchable reflection device is of high resistance for RF signals/microwave signals, and the lambda/4 line has effectively an open circuit at the end (second end) of the second port. Since the lambda/4 line inverts impedance, this means that the lambda/4 line at its end (first end) directly or indirectly connected to the transistor device output will be seen as a short circuit, and then the lambda/4 line causes a total reflection of microwave power at the connecting point (branching point) of the feeding line. All microwave power flowing into the feeding line will be reflected at the connecting point (branching point) to the lambda/4 line, and no microwave power will arrive at the end of the feeding line.

In this way, the decaying microwave power of the at least one transistor amplifier device output can be cut off by means of the at least one switchable reflection device. At the microwave output of the microwave power arrangement, the generated microwave pulses appear sharp, and noise is minimized in the subsequent pulsed EPR experiment.

The X-band comprises 8-12 GHz. Note that typically, the microwave frequency MV used in the invention is 9-10 GHz. The lambda/4 lines and the feeding lines (local feeding lines or switching line) are in general 50 Ohm matched lines. The lambda/4-lines may have a geometric length L of lambda/4, or a geometric length of (lambda/4+N*lambda/2), with N a natural number. Note that c=lambda*MF, with c: propagation speed. It should be noted that the wavelength lambda is a function of the microwave frequency and of the provided propagation medium in the line (vacuum or some dielectric). It should also be noted that the microwave radiation may have some bandwidth of microwave frequency (with a typical bandwidth on the order of 0.5 GHz up to 2 GHz), and the wavelength lambda then refers to an average microwave frequency of the microwave radiation. Note that the match of lambda/4 and the geometric length L of the line is not "exact", but typically within L=K*lambda/4 or within L=(K*lambda/4+N*lambda/2), with 0.9≤K≤1.1. Further often L is somewhat smaller than lambda/4, i.e., L<lambda/4 or L<(lambda/4+N*lambda/2), e.g., by choosing 0.9≤K<1 (see before); this can improve the function (in particular reflection efficiency) of the switchable reflection devices.

Note that when the match of geometric length L and lambda/4 was exact, absolutely no current would flow through the diode in either switching state. However, due to diode capacity and line inductivity, and bandwidth of microwave radiation, some remaining electric current can occur at the PIN diode, but the remaining current is much lower as compared to the electric current coming along with the amplified microwave pulses (e.g., by a factor of 100 or more). Accordingly, the invention is well suited for providing high power of amplification of microwave pulses, in particular microwave pulses of a power of several hundreds of Watts. A plurality of transistor amplifier devices may be combined for this purpose, and remaining current through a PIN diode can be reduced by distributing the remaining current over a plurality of switchable reflection devices. Note that with higher microwave powers, EPR experiments may be run in shorter times. Also note that for PIN diodes, the size of its I region determines the switching speed. The smaller the I region, the faster the switching speed. On the other hand, the smaller the size of the I region the less power may be dissipated. So the size of the I region should be chosen small enough such that switching speeds of less than 80 ns can be achieved to be useful for typical pulsed EPR, but on the other hand, the PIN diode has to withstand the RF current when the diodes are biased. In general, sizes of the I region adapted for switching speeds of 30 ns-70 ns, or 30-50 ns, in particular about 50 ns, are preferred. In particular, a size of the I region adapted for a switching speed of 50 ns in a switching stage comprising three switchable reflection devices/PIN diodes and a solid state power amplifier having a rat race type combining circuit arrangement of four transistor amplifier devices has led to excellent EPR measurement quality. In general, after a microwave pulse has ended, the invention can provide to return to a noise level about 20 dB above the thermal noise level (e.g., defined at −174 dBm at 1 Hz bandwidth) in less than 50 ns.

Typically, each transistor amplifier device comprises only one amplifying transistor, but alternatively may also comprise a plurality of amplifying transistors. Each transistor amplification device typically has a power of amplification of between 100 W and 500 W, often between 200 W and 400 W, preferably about 300 W. An entire microwave power amplifier arrangement typically has a total power of amplification of between 600 W and 2400 W, often between 800 W and 1600 W, preferably between 1000 W and 1200 W.

Embodiments with Combined Stages

A preferred embodiment of the inventive microwave power amplifier arrangement provides that the microwave power amplifier arrangement comprises a number NC of combined stages, with NC≥2, wherein each combined stage comprises a combined stage input, at least one transistor amplifier device, a local feeding line, at least one switchable reflection device and a combined stage output, with the combined stage input being connected to the transistor amplifier device input of the at least one transistor amplifier device of the combined stage, with the transistor amplifier device output of the at least one transistor amplifier device of the combined stage being connected to the combined stage output via the local feeding line, and with the local feeding line connected to the lambda/4 line of the at least one switchable reflection device of the combined stage. In this setup, the switchable reflection devices are dedicated to particular transistor amplifier devices; cutting off of noise tails is accomplished locally within each combined stage separately. In other words, each combined stage can supply amplified microwave pulses for EPR with cut off noise tail, and a number of combined stages may be combined to increase power. In this embodiment, the (remaining) currents at the PIN diodes can be kept small, even in case of high total powers of amplification, since each PIN diode handles only a part of the transistor amplification devices. The combined stages are typically connected via a combining circuit arrangement, such as a rat race type arrangement. Note that in a preferred subvariant, each combined stage comprises only one transistor amplification device, and only one switchable reflection device.

In a preferred further development, 2≤NC≤6, in particular NC=4. In this way, increased total powers of amplification required for typical EPR applications can be achieved in a simple and inexpensive way.

Embodiments with Amplifier Stage and Switching Stage

Further preferred is an embodiment wherein the microwave power amplifier arrangement comprises
  a solid state power amplifier stage, with the microwave input, at least one transistor amplifier device, and an amplifier stage output,
  a switching stage, with a switching stage input, a switching line, at least one switchable reflection device, and the microwave output,
  wherein the transistor amplifier device outputs of the transistor amplifier devices are directly or indirectly connected to the amplifier stage output,
  wherein the amplifier stage output is connected to the switching stage input,
  wherein the switching line connects the switching stage input with the microwave output,
  and wherein for each switchable reflection device of the switching stage, the lambda/4 line of this switchable reflection device is connected to the switching line and to the first port of the PIN diode of this switchable reflection device. In this embodiment, the amplification function can be summarized in the solid state power amplifier stage, and the noise tail cut-off function can be summarized in the switching stage. Note that typically in this embodiment, there are a plurality of transistor amplifier devices comprised in the solid state power amplification stage, and there are a plurality of switchable reflection devices comprised in the switching stage. This setup is particularly simple and proven in practice, in particular to provide large amplification power. The switching line may comprise a capacitor between the switching stage input and a (first) connection point (branching point) of a switchable reflection device, and/or may comprise a capacitor between a (last) connection point (branching point) of a switchable reflection device and the microwave output. Typically, each switchable reflection device has an own connection point (branching point) on the switching line.

In an advantageous further development, the switching stage comprises ND switchable reflection devices connected in parallel to the switching line, with ND 2. In practice, the microwave radiation has some bandwidth, and some (small) currents can occur at the PIN diodes. When using multiple switchable reflection devices, the overall remaining current can be distributed; then each PIN diode is less burdened, and the microwave power amplifier arrangement can provide a higher pulsed microwave power.

Preferably, in a subvariant of the above further development, for the number ND of switchable reflection devices applies 2≤ND≤4, in particular ND=3. With such a number ND, amplification power for typical pulsed EPR application can be comfortably and inexpensively provided.

In another subvariant of the above further development, connection points between switchable reflection devices connected subsequently to the switching line are separated by line sections of the switching line of a maximum length of lambda/4, with lambda being the wavelength of the microwave radiation in the line sections. With the separating line sections of a respective geometric length of lambda/4 or shorter, more efficient dampening/reflection of microwave radiation or improved noise cancelling can be achieved. Note that in accordance with the invention, it is also possible to use a common connection point for multiple or all reflection devices connected to the switching line, i.e., to do without separating line sections of the switching line.

In a preferred further development, the solid state power amplifier stage comprises a number NT of transistor amplifier devices, with NT≥2. Often, 2≤NT≤8 or NT≥4 applies. With the plurality of transistor amplifier devices, the total power of amplification can be increased.

In a preferred subvariant of the above further development, the solid state power amplifier stage comprises a combining circuit arrangement of transistor amplifier devices. The combining circuit arrangement may be for example a rat race type arrangement, or a Wilkinson type arrangement, or a Hybrid 3 dB type arrangement. The combining circuit arrangement may combines at least 2, preferably at least 4, transistor amplifier devices.

Preferably, a number NRT of transistor amplifier devices are combined in the combining circuit arrangement, with NRT=4. This is particularly simple in design and offers high power of amplification, sufficient for numerous pulsed EPR applications.

Advantageously, the solid state power amplifier stage comprises at least one transistor amplifier device acting as preamplifier, connected between the microwave input and the combining circuit arrangement. In particular, two preamplifiers connected in series may be applied. In this way, particularly high powers of amplification of microwave pulses may be obtained. It should be noted that preferably preamplifiers are also operated with synchronized control signals (see below). As a side remark, one or more pre-amplifying transistor amplifier devices may also be used connected between the microwave input and a combining circuit arrangement of combined stages (see above).

Further Embodiments

In an advantageous embodiment, the microwave power amplifier arrangement further comprises a gating signal stage, for providing synchronized control signals to a control input of each transistor amplifier device and to the first port of each PIN diode, with the each control signals containing first control signals lasting for the duration of a respective microwave pulse. In this way, the amplification function as well as the cut-off function may be operated very efficiently in a coordinated way, and noise tails may be minimized. The control signal at a switchable reflection device is typically provided at the side of the lambda/4 line connected directly or indirectly to a transistor amplifier device output (i.e., opposite to the side connected to the PIN diode), e.g., at a feeding line. In particular, the control signal may be provided at the local feeding line of a combined stage, or at the switching line of a switching stage. Note that control signals for different transistor amplifier devices and PIN diodes may have different polarity and/or amplitude and/or timing; however preferably, all control signals have the same polarity and amplitude and timing. A typical amplitude of a control signal, in particular a first control signal, is 5 V or less. The (switched) control signals may be of DC type.

Further within the scope of the present invention is an electron paramagnetic resonance (EPR) system for measuring an EPR spectrum of a sample with pulsed EPR, comprising
- a microwave source for providing a microwave signal with a microwave frequency MF, with MF in the X-band,
- a microwave power amplifier arrangement according to one of the foregoing embodiments,
- a microwave resonator, containing a sample space for the sample,
- a signal amplifier, in particular a low noise amplifier, and
- a microwave receiver. With the inventive EPR system, spectra of the sample can be obtained with low noise level or high sensitivity, respectively. The microwave source may be based on a microwave oscillator, which provides a continuous microwave signal to the microwave input of the microwave power amplifier arrangement. Alternatively, the microwave source may be based on a microwave oscillator and a downstream modulator, which together provide a modulated microwave signal to the microwave input of the microwave power amplifier arrangement. Note that the modulation may be of on/off type, or a linear modulation, or another type of modulation. If a modulated microwave signal is fed to the microwave input, the synchronized control signals generated by a gating signal stage (which control the transistors and the PIN diodes), e.g., DC control signals, are typically synchronized with the modulation.

In a preferred embodiment of the inventive EPR system, the EPR system further comprises a circulator, wherein the circulator is adapted for forwarding microwave pulses from the microwave power amplifier arrangement to the resonator, and for forwarding microwave signals from the resonator to the signal amplifier and the microwave receiver which is connected downstream of the signal amplifier. This setup is simple and proven in practice.

Further within the scope of the present invention is a method for operating an inventive microwave power amplifier arrangement as described above or a microwave power amplifier arrangement of an inventive EPR system as described above in an EPR measurement, wherein a microwave signal of a microwave radiation of the microwave frequency MF is provided to the microwave input of the microwave power amplifier arrangement, with MF being in the X-band, wherein microwave pulses of the microwave radiation are generated at the microwave output of the microwave power amplifier arrangement, and wherein synchronized control signals are provided to a control input of each transistor amplifier device and to the first port of each PIN diode, with the control signals comprising first control signals lasting for the duration of a respective microwave pulse, in particular with the microwave pulses having a duration TP of TP≤20 ns. With such a method, EPR spectra of samples may be obtained with low noise level or high sensitivity, respectively. The (switched) control signal is typically of DC type.

Further advantages of the invention can be derived from the description and the drawings. Also, the above-mentioned and the still further described features can be used according to the invention individually or in any combination. The embodiments shown and described are not to be understood as a conclusive list, but rather have an exemplary character for the description of the invention.

DETAILED DESCRIPTION

Figure 1:
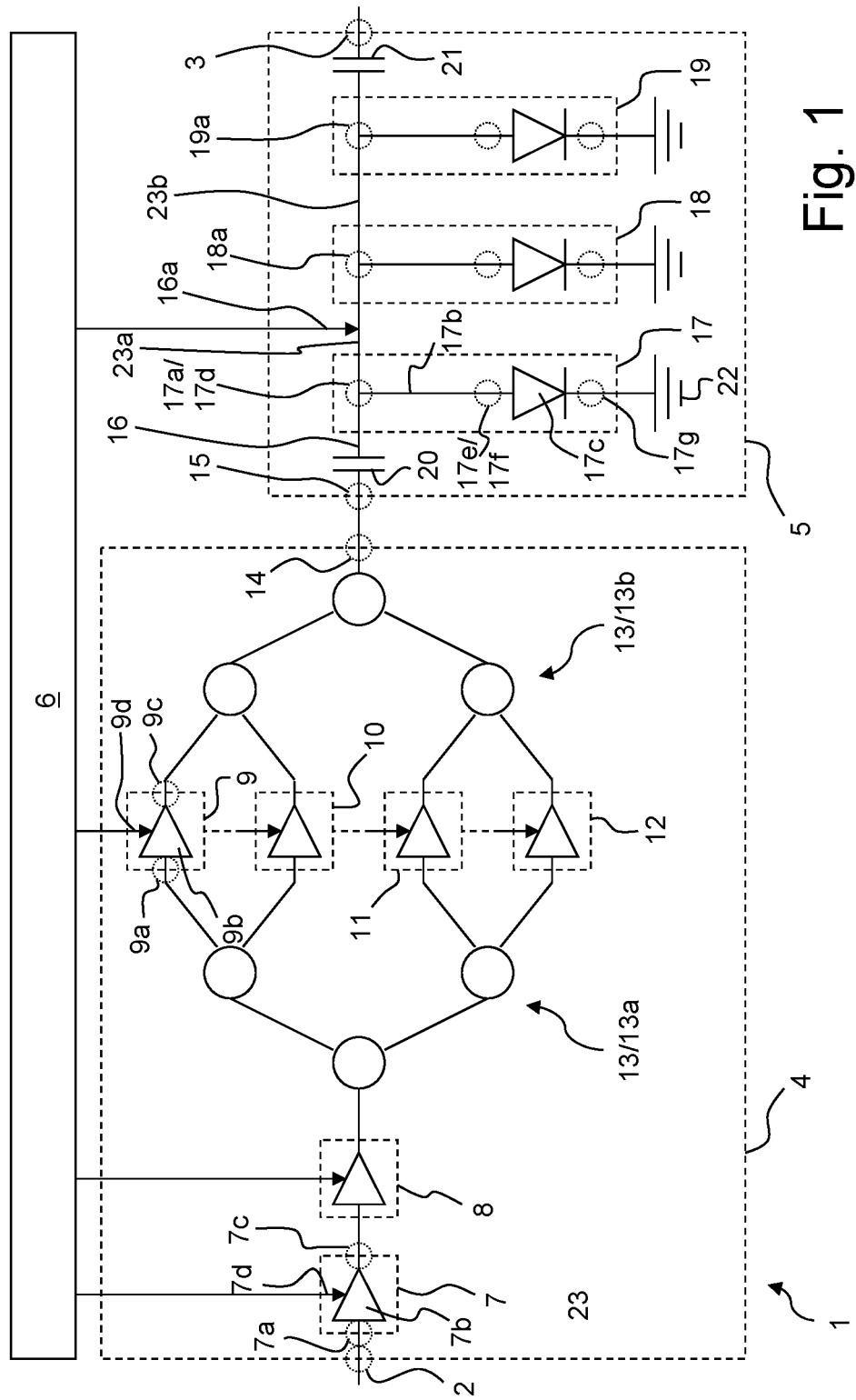
FIG. 1 illustrates schematically an exemplary first embodiment of an inventive microwave power arrangement, with a solid state power amplification stage and a switching stage.

FIG. 1 illustrates a first exemplary embodiment of an inventive microwave power amplifier arrangement 1 for providing amplified microwave pulses of a microwave radiation.

Figure 3:
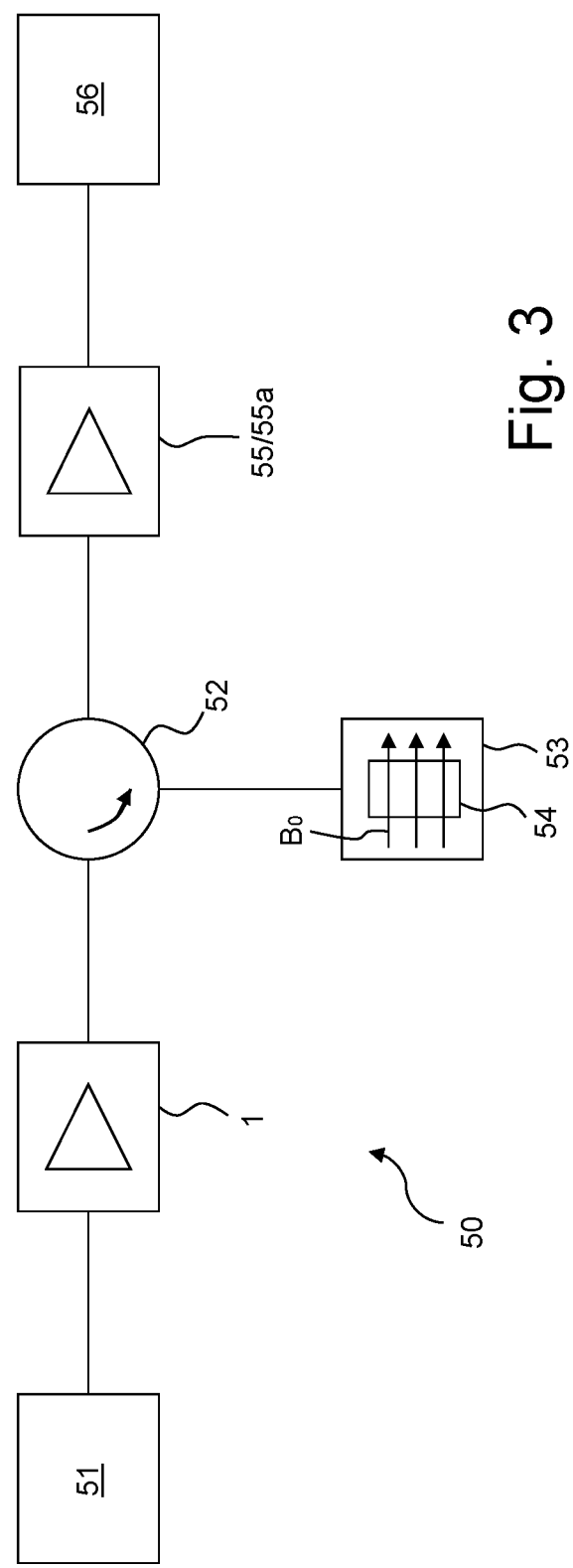
FIG. 3 illustrates schematically an exemplary embodiment of an inventive EPR system.

At a microwave input 2 of the arrangement 1, a microwave signal of a microwave radiation is provided, e.g., by a microwave source (compare FIG. 3). The microwave radiation has an average microwave frequency MF, and is continuous here (however note that the microwave signal fed at microwave input 2 may also be modulated, though). The microwave frequency MF is in the X-band, for example with MF between 9 GHz and 10 GHz. At a microwave output 3 of the arrangement 1, amplified microwave pulses of the microwave radiation are provided.

In the embodiment shown, the microwave power amplifier arrangement 1 comprises a solid state power amplifier stage 4, a switching stage 5, and a gating signal stage 6.

The solid state power amplifier stage 4 here comprises two transistor amplifier devices 7, 8 connected in series to the microwave input 2, acting as preamplifiers for the microwave signal fed at the microwave input 2. Further, the solid state power amplifier stage 4 comprises here four transistor amplifier devices 9, 10, 11, 12 in a combining circuit arrangement 13. So in total, there are six transistor amplifier devices 7-12 in the solid state power amplifier stage 4, i.e., NT=6, and in the combining circuit arrangement 13, there are NRT=4 transistor amplifier devices 9-12. The combining circuit arrangement 13 comprises a power splitter 13a, which distributes the pre-amplified microwave signal onto the transistor amplifier devices 9-12, and a power combiner 13b, which adds the amplified microwave signals provided by the individual transmitter amplifier devices 9-12. The combining circuit arrangement 13 is here of rat race type. The combined amplified microwave signals are provided at an amplifier stage output 14.

Each transistor amplifier device 7-12 has a transistor amplifier device input 7a, 9a, at least one transistor 7b, 9b, a transistor amplifier device output 7c, 9c, and a control input 7d, 9d. For simplification, this is only illustrated for transistor amplifier devices 7 and 9 in FIG. 1. The transistor amplifier device inputs 7a, 9a are directly (see device 7) or indirectly (see devices 8-12) connected to the microwave input 2. The transistor amplifier device outputs 7c, 9c are directly or indirectly (see devices 7-12) connected to the microwave output 3. The transistor amplifier devices 7-12 or their respective transistors 7b, 9b each receive a control signal via their respective control inputs 7d, 9d from the gating signal stage 6.

In the example shown, the control signal is of DC type. For a desired duration of a respective amplified microwave pulse (chosen in the example e.g., with a duration of 10 ns per pulse, i.e., TP=10 ns), the control signal is at a small voltage, for example at +5V ("first control signal"), and during desired breaks between microwave pulses, the control signal is zero (or negative) ("second control signal"). As long as the control signal indicates a desired pulse (i.e., the first control signal is applied), the transistor amplifier stages 7-12 amplify the microwave signal applied at their input 7a, 9a, and provide amplified microwave signal at their respective output 7c, 9c. However, due to parasitic effects, amplified microwave radiation does not cease at the transistor amplifier stage outputs immediately after the control signal has switched to zero (or negative), but rather the amplified microwave radiation decays over some time.

In the illustrated example, amplified microwave radiation present at amplifier stage output 14 decays over some time after the control signal has switched to zero, and with the switching stage 5, the decaying microwave radiation can be cut off so it does not reach the microwave output 3.

In the illustrated example, the switching stage 5 comprises a switching stage input 15, a switching line 16, here three switchable reflection devices 17, 18, 19, i.e. ND=3, and the microwave output 3. The amplifier stage output 14 is connected to the switching stage input 15. The switchable reflection devices 17, 18, 19 are separately connected to the switching line 16 at connection points 17a, 18a, 19a, sometimes also called branching points. The switchable reflection devices 17, 18, 19 are connected in parallel to the switching line 16.

Between the switching stage input 15 and the connection point 17a of the first switchable reflection device 17 connected, the switching line 16 includes a capacitor 20 here. Further, between the connection point 19a of the last switchable reflection device 19 and the microwave output 3, the switching line 16 includes a capacitor 21 here.

The switching line 16 has a control connection 16a to the gating signal stage 6 for receiving a control signal, here a DC type control signal, which is synchronized with the control signals received by the transistor amplifier devices 7-12.

Each switchable reflection device 17, 18, 19 comprises a lambda/4 line 17b and a PIN diode 17c. For simplification, this is only illustrated for switchable reflection device 17 in FIG. 1 (also applies to further discussion). A first end 17d of the lambda/4 line is connected to the switching line 16 at connection point 17a. A second end 17e of the lambda/4 line 17b is connected to a first port 17f of the PIN diode 17c. A second port 17g of the PIN diode 17c is connected to ground 22. Ground 22 represents the reference voltage of the arrangement 1, typically a zero voltage ("earthed"). The first end 17d is directly or indirectly (see devices 17-19) connected to the transistor amplifier device outputs 7c, 9c.

The geometric length L of the lambda/4 line 17b is chosen such that it substantially corresponds to ¼ of the wavelength lambda (also abbreviated λ) of the microwave radiation of microwave frequency MF within the line 17b. Note that the wavelength λ (for the given microwave frequency MF) depends on the material properties of the lambda/4 line 17b, with c=MF*λ, with c: propagation speed, and c=$c_0$/n, with $c_0$: speed of light in vacuum and n: refractive index in the lambda/4 line.

Between the connection points 17a and 18a and between the connection points 18a and 19a, the switching line 16 is formed with line sections 23a, 23b. Their geometric length, in the illustrated example, also substantially corresponds to ¼ of the wavelength lambda of the microwave radiation with microwave frequency MF within the line sections 23a, 23b.

The control signal provided by the gating signal stage 6 via control connection 16a at the switching line 16 is, via the lambda/4 lines 17b, applied to the first ports 17f of the PIN diodes 17c. In the illustrated example, as long as a microwave pulse is desired, the control signal at the first ports 17f is at a small positive voltage ("first control signal"), e.g., at +5V, and else the control signal is zero (or negative) ("second control signal"). The (continuous/average) electric current caused by a first control signal across a PIN diode 17c is typically on the order of a few tens of milliamperes, which is much smaller than the microwave current that passes through the switching line 16 during a pulse, such as by a factor of at least 100.

As long as the (here DC type) control signal at the first port 17f is at the (here) positive voltage ("biased state", i.e., the first control signal is applied), the ohmic resistance of the PIN diode 17c approaches zero, i.e., the PIN diode 17c is conductive. Accordingly, the second end 17e of the lambda/4 line is short-circuited with ground 22. Since the lambda/4 line inverts impedance at its first end 17d as compared to its second end 17e, the first end 17d effectively "disappears" for microwave radiation propagating from the switching input 15 along the switching line 16. The microwave power may pass the branching points 17, 18a, 19a unhindered then.

As long as the (here DC type) control signal at the first port 17f is at (here) zero voltage (or negative voltage) ("non-biased state", i.e., the second control signal is applied), the ohmic resistance of the PIN diode 17c becomes large, i.e., the PIN diode 17c is non-conductive. Then the lambda/4 line 17b has an "open" second end 17e. Since the lambda/4 line inverts impedance at its first end 17d as compared to its second end 17e, the first end 17d acts as a short circuit. Microwave radiation propagating from the switching input 15 into the switching line 16 is blocked and reflected at the branching points 17a, 18a, 19a by the switchable reflection devices 17-19, and no microwave power reaches the microwave output 3 then.

By setting the control signal at the control connection 16a or the first ports 17f of the PIN diodes 17c to zero (or negative voltage) during breaks between microwave pulses ("second control signal"), decaying microwave power flowing out of the solid state power amplifier stage 4 after the (first) control signal has ended at transistor amplifier stages 7-12 can be cut off from the microwave output 3. On the other hand, by setting the control signal at the control connection 16a or the first ports 17f of the PIN diodes to positive voltage during microwave pulses ("first control signal"), the switchable reflection devices 17-19 are effectively deactivated, and the microwave radiation may propagate through the switching line 16 to the microwave output 3.

Thus, the amplified microwave pulses provided at microwave output 3 come along with a reduced noise tail in an EPR measurement in which they are used subsequently.

Figure 2:
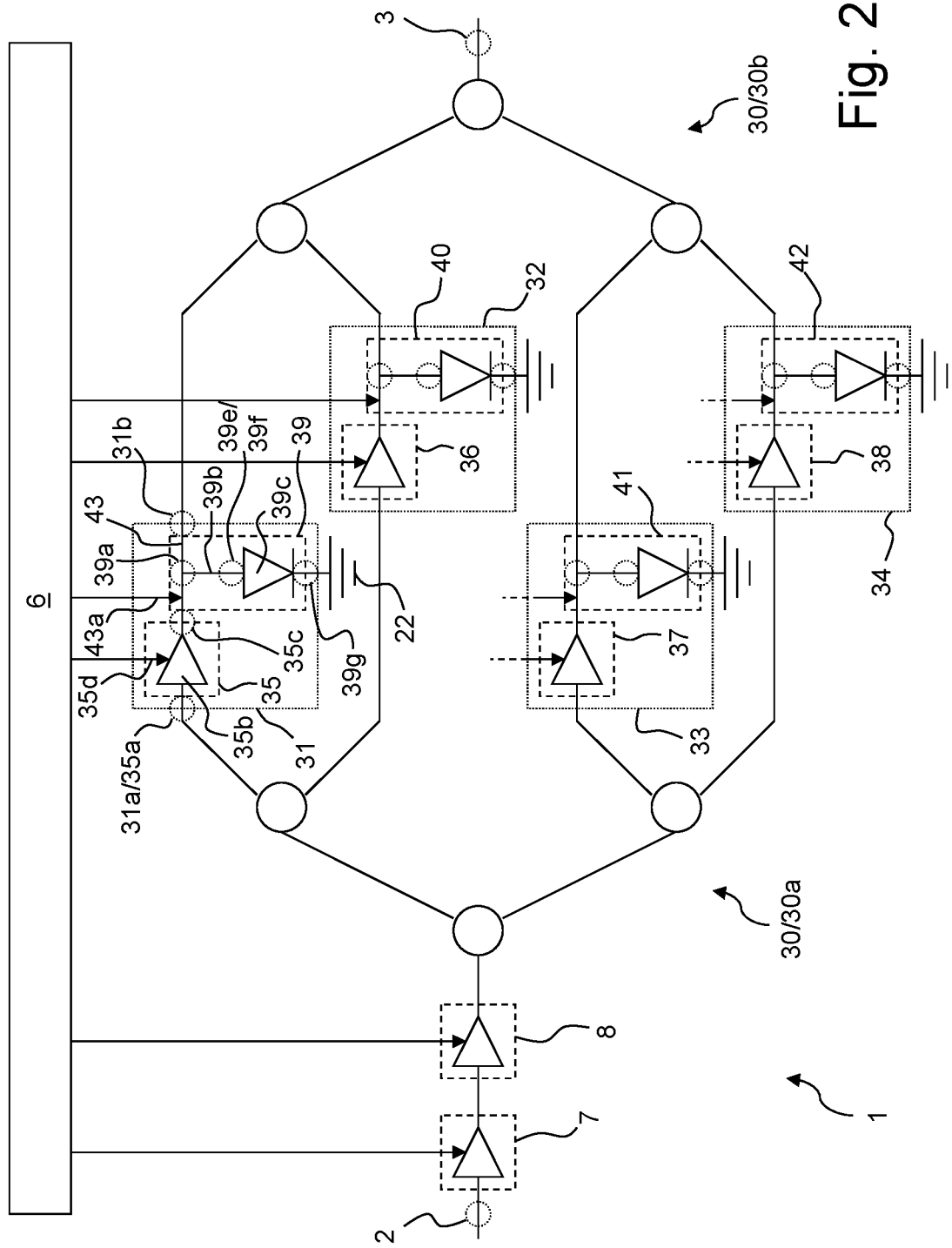
FIG. 2 illustrates schematically an exemplary second embodiment of an inventive microwave power arrangement, with a plurality of combined stages.

FIG. 2 illustrates a second exemplary embodiment of an inventive microwave power amplifier arrangement 1, similar to the embodiment shown in FIG. 1, so only the major differences are explained in detail.

The microwave power amplifier arrangement 1 of FIG. 2 comprises a microwave input 2 where a microwave signal of microwave radiation is fed in, and a microwave output 3 where amplified microwave pulses are provided.

The microwave signal is pre-amplified at transistor amplifier devices 7, 8, and the pre-amplified microwave signal is distributed in a combining circuit arrangement 30 via power splitter 30a to here four combined stages 31, 32, 33, 34, i.e., NC=4. The combining circuit arrangement 30 of combined stages 31-34 is here of rat race type.

Each combined stage 31-34 comprises here a transistor amplifier device 35, 36, 37, 38 and a switchable reflection device 39, 40, 41, 42. In the example shown, the respective combined stage input 31a is connected to the respective transistor amplifier device input 35a, and the transistor amplifier device output 35c is connected to a combined stage output 31b by a local feeding line 43. The local feeding line 43 has a connection point 39a to the respective switchable reflection device 39-42. The switchable reflection device 39-41 comprises a lambda/4 line 39b and a PIN diode 39c, with a first end 39d of the lambda/4 line 39b connected via the connection point 39a to the local feeding line 43, and with its second end 39e connected to the first port 39f of the PIN diode 39c. The second port 39g of the PIN diode 39c is connected to ground 22. Note that for simplification, this is only illustrated for the combined stage 31 in FIG. 2.

The amplified microwave signals of combined stage outputs 31b of the combined stages 31-34 are added by a power combiner 30b of the combining circuit arrangement 30, and the added amplified microwave signals, i.e., amplified microwave pulses, are provided at microwave output 3.

Synchronized control signals are provided by the gating signal stage 6 to the pre-amplifying transistor amplifier devices 7, 8, to the transistor amplifier devices 35-38 of combined stages 31-34 via control inputs 35d of transistors 35b, and to the local feeding lines 43 via control connections 43a.

In the combined stages 31-34, the decaying microwave radiation flowing off at a local respective transistor amplifier device output 35c after a (first) control signal has stopped at a respective local transistor amplifier device 35-39 is immediately blocked by the local switchable reflection device 39-42 connected to the local feeding line 43, as described above for the switchable reflection devices 17-19 connected to the switching line 16 in FIG. 1.

Therefore, also in the embodiment of FIG. 2, the amplified microwave pulses provided at microwave output 3 come along with a reduced noise tail in the EPR measurement in which they are used.

While in the embodiment of FIG. 1, the overall noise tail is cut after combining the power of several transistor amplifier devices, in the embodiment of FIG. 2, the individual noise tails are cut off before combining the power of several transistor amplifier devices.

FIG. 3 illustrates by way of example an inventive EPR system 50 for investigating a sample 54 by a pulsed EPR spectroscopic measurement.

The EPR system 50 comprises a microwave source 51, providing a microwave signal to be amplified. The microwave source 51 may be an oscillator providing a continuous microwave radiation, or may be an oscillator coupled to a modulator which together provide a modulated microwave signal (not shown in detail). The microwave signal to be amplified is fed into a microwave power amplifier arrangement 1, for example as described in FIG. 1 or FIG. 2, which provides amplified microwave pulses. In the embodiment shown, the amplified microwave pulses are fed into a circulator 52, which forwards the amplified microwave pulses to a microwave resonator 53.

The microwave resonator 53 contains the sample 54 to be investigated, wherein the sample 54 is exposed to a strong static magnetic field $B_0$ generated by a magnet, e.g., a permanent magnet or an electromagnet (magnet not shown for simplification). Some microwave radiation is absorbed by the sample 54 in a way characteristic for the material of the sample 54.

Resulting microwave radiation propagates from the resonator 53 to the circulator 52, and is forwarded to a signal amplifier 55, here a low noise signal amplifier 55a, and the microwave radiation amplified this way is registered at a microwave receiver 56.

LIST OF REFERENCE SIGNS 1 microwave power amplifier arrangement
2 microwave input
3 microwave output
4 solid state power amplifier stage
5 switching stage
6 gating signal stage
7 transistor amplifier device
7a transistor amplifier device input
7b transistor
7c transistor amplifier device output
7d control input
8 transistor amplifier device
8a transistor amplifier device input
8b transistor
8c transistor amplifier device output
8d control input
9 transistor amplifier device
9a transistor amplifier device input
9b transistor
9c transistor amplifier device output
9d control input
10, 11, 12 transistor amplifier devices
13 combining circuit arrangement (of solid state power amplifier stage)
13a power splitter
13b power combiner
14 amplifier stage output
15 switching stage input
16 switching line
16a control connection of switching line
17 switchable reflection device
17a connecting point/branching point
17b lambda/4 line
17c PIN diode
17d first end of lambda/4 line
17e second end of lambda/4 line
17f first port of PIN diode
17g second port of PIN diode
18, 19 switchable reflection devices
20, 21 capacitors
22 ground
23a, 23b line section of switching line
30 combining circuit arrangement (for combined stages)
30a power splitter
30b power combiner
31 combined stage
31a combined stage input
31b combined stage output
32, 33, 34 combined stages
35 transistor amplifier device
35a transistor amplifier device input
35b transistor
35c transistor amplifier device output
35d control input
36, 37, 38 transistor amplifier devices
39 switchable reflection device
39a connecting point/branching point
39b lambda/4 line
39c PIN diode 39d first end of lambda/4 line
39e second end of lambda/4 line
39f first port of PIN diode
39g second port of PIN diode
40, 41, 42 switchable reflection devices
43 local feeding line
43a control connection of local feeding line
50 EPR system
51 microwave source
52 circulator
53 microwave resonator
54 sample
55 signal amplifier
55a low noise signal amplifier
56 microwave receiver
$B_0$ static magnetic field

The invention claimed is:

1. A microwave power amplifier arrangement for an electron paramagnetic resonance (EPR) system, the arrangement being adapted for providing amplified microwave pulses of a microwave radiation having a frequency MF in the X-band, and having a microwave input and a microwave output, the arrangement comprising:
one or more transistor amplifier devices each having:
a transistor amplifier device input directly or indirectly connected to the microwave input,
at least one transistor, and
a transistor amplifier device output directly or indirectly connected to the microwave output, and
one or more switchable reflection devices each having:
a PIN diode; and
a lambda/4 line connected directly or indirectly to a transistor amplifier device output of at least one transistor amplifier device and to a first port of the PIN diode, with lambda being the wavelength of the microwave radiation within the lambda/4 line, and a second port of the PIN diode being connected to ground.

2. A microwave power amplifier arrangement according to claim 1, further comprising a number NC of combined stages, with NC≥2, wherein each combined stage includes a combined stage input, at least one of said transistor amplifier devices, a local feeding line, at least one of said switchable reflection devices and a combined stage output,
wherein the combined stage input is connected to the transistor amplifier device input of the at least one of said transistor amplifier devices of the combined stage, the transistor amplifier device output of the at least one transistor amplifier device of the combined stage is connected to the combined stage output via the local feeding line, and the local feeding line is connected to the lambda/4 line of the at least one switchable reflection device of the combined stage.

3. A microwave power amplifier arrangement according to claim 2, wherein 2≤NC≤6.

4. A microwave power amplifier arrangement according to claim 1,
wherein the one or more transistor amplifier devices are part of a solid state power amplifier stage that receives the microwave input and provides an amplifier stage output, and the one or more switchable reflection devices are part of a switching stage having a switching line, the switching stage receiving a switching stage input and providing the microwave output,
wherein each transistor amplifier device output is directly or indirectly connected to the amplifier stage output,
wherein the amplifier stage output is connected to the switching stage input,
wherein the switching line connects the switching stage input to the microwave output, and
wherein, for each switchable reflection device of the switching stage, the lambda/4 line is connected to the switching line and to the first port of the PIN diode.

5. A microwave power amplifier arrangement according to claim 4, wherein the switching stage comprises ND switchable reflection devices connected in parallel to the switching line, with ND≥2.

6. A microwave power amplifier arrangement according to claim 5, wherein 2≤ND≤4.

7. A microwave power amplifier arrangement according to claim 5, wherein connection points between switchable reflection devices that are connected subsequently to the switching line are separated by line sections of the switching line that have a maximum length of lambda/4, with lambda being the wavelength of the microwave radiation in the line sections.

8. A microwave power amplifier arrangement according to claim 4, wherein the solid state power amplifier stage comprises a number NT of transistor amplifier devices, with NT≥2.

9. A microwave power amplifier arrangement according to claim 8, wherein the solid state power amplifier stage comprises a combining circuit arrangement including a plurality of the transistor amplifier devices.

10. A microwave power amplifier arrangement according to claim 9, wherein a number NRT of the transistor amplifier devices are combined in the combining circuit arrangement, with NRT=4.

11. A microwave power amplifier arrangement according to claim 9, wherein the solid state power amplifier stage comprises at least one transistor amplifier device acting as a preamplifier, connected between the microwave input and the combining circuit arrangement.

12. A microwave power amplifier arrangement according to claim 1, further comprising a gating signal stage for providing synchronized control signals to a control input of each transistor amplifier device and to the first port of each PIN diode, with the control signals containing first control signals lasting for a duration of a respective microwave pulse.

13. An electron paramagnetic resonance (EPR) system for measuring an EPR spectrum of a sample with pulsed EPR, comprising:
a microwave source for providing a microwave signal with a frequency MF in the X-band,
a microwave power amplifier arrangement according to claim 1,
a microwave resonator containing a sample space for the sample,
a signal amplifier, and
a microwave receiver.

14. An EPR system according to claim 13, further comprising a circulator configured to forward microwave pulses from the microwave power amplifier arrangement to the resonator, and to forward microwave signals from the resonator to the signal amplifier and the microwave receiver, which is connected downstream of the signal amplifier.

15. A method for operating a microwave power amplifier arrangement according to claim 1, comprising:
providing a microwave signal of a microwave radiation of the frequency MF in the X-band to the microwave input of the microwave power amplifier arrangement, generating microwave pulses of the microwave radiation at the microwave output of the microwave power amplifier arrangement, and providing synchronized control signals to a control input of each transistor amplifier device and to the first port of each PIN diode, with the control signals comprising first control signals lasting for the duration of a respective microwave pulse.

16. A method according to claim 15 wherein the microwave pulses have a duration TP of TP≤20 ns.

* * * * *